United States Patent
Yamaguchi et al.

[11] Patent Number: 5,929,461
[45] Date of Patent: Jul. 27, 1999

[54] OPTICAL SEMICONDUCTOR DEVICE HAVING A SEMICONDUCTOR LAMINATE MIRROR

[75] Inventors: Takeharu Yamaguchi; Michio Ohkubo; Takao Ninomiya, all of Kanagawa, Japan

[73] Assignee: The Furukawa Electric Co., Ltd., Tokyo, Japan

[21] Appl. No.: 08/877,768

[22] Filed: Jun. 17, 1997

[30] Foreign Application Priority Data

Jun. 17, 1996 [JP] Japan .................................. 8-177022

[51] Int. Cl.$^6$ .......................... H01L 29/06; H01L 33/00
[52] U.S. Cl. ................ 257/15; 257/22; 257/98; 257/432; 257/436
[58] Field of Search .................... 257/94, 96, 98, 257/103, 432, 436, 15, 18, 22; 372/45, 96

[56] References Cited

U.S. PATENT DOCUMENTS 5,732,098  3/1998  Nisitani et al. ..................... 257/97

*Primary Examiner*—Minh Loan Tran
*Attorney, Agent, or Firm*—Helfgott & Karas, PC

[57] ABSTRACT

A surface emission semiconductor laser device has a semiconductor laminate mirror constituted of a plurality of pairs of InGaAS/InAlP films epitaxially grown on a GaAs or InGaAs substrate and a laser element bonded to the laminate mirror. The InAlP films of the laminate mirror are lattice-matched or not lattice-matched due to the amount of Al in the InAlP films. The laminate mirror has a high relative refractive index between the InGaAs and InAlP films and thus has a high reflectance to thereby improve the emission efficiency of the surface emission laser device.

6 Claims, 3 Drawing Sheets

OPTICAL SEMICONDUCTOR DEVICE HAVING A SEMICONDUCTOR LAMINATE MIRROR

BACKGROUND OF THE INVENTION (a) Field of the Invention

The present invention relates to an optical semiconductor device and a method of manufacturing the same and, more particularly, to the technique for forming a semiconductor laminate mirror, which has a high reflectance and/or surface refractive anisotropy, in a semiconductor laser device such as a surface emission laser, optical cavity and photodetector.

(b) Description of the Related Art

A semiconductor laminate mirror is generally used in an optical semiconductor device such as a surface emission laser device. To fabricate the semiconductor laminate mirror by a known epitaxial process, it is necessary to form two kinds of thin films in pairs constituting the semiconductor laminate mirror from materials of substantially the same lattice constant as that of the laser active layer, i.e., from materials lattice-matched with the laser active layer.

In the semiconductor laminate mirror, it is desirable to incorporate materials providing a higher reflectance by a less number of layers to reduce optical absorption by the mirror. To achieve this, a higher ratio needs to be set between the refractive indices of the two rinds of thin semiconductor films, one having a high refractive index and the other having a low refractive index, both constituting the semiconductor laminate mirror.

In the meantime, polarization control in the surface emission laser device is extremely important in view of the polarization dependency of the current optical devices. To achieve an anisotropy in polarized light emitted by the surface emission laser device, the prior art teaches the following methods:

(i) emitted light is subjected to an anisotropic optical loss;

(ii) an elliptical hole is formed in the laminate to apply an anisotropic stress thereto;

(iii) a diffraction grating is provided on the laminate mirror;

(iv) anisotropy is provided in the horizontal structure of an optical oscillator itself; and (v) anisotropic matrix elements substituting in a strained quantum well are used.

The methods (i) to (iii) as mentioned above more complicate each fabrication process, the method (iv) causes anisotropy to the light distribution in case of a surface emission laser device, and the method (v) may allow no independent design for the active layer from the design for the anisotropy.

Prior art does not teach any combination of materials providing a sufficiently high ratio of the refractive indices (i.e., relative refractive index) between the InP substrate and materials lattice-matched with the InP substrate. By contrast, such a combination is known in the case of a GaAs substrate wherein the GaAs substrate and materials lattice-matched with the GaAs are used. Accordingly, a direct bonding technique is generally used in the prior art surface emission laser device to lase at 1.3 $\mu$m or 1.55 $\mu$m, wherein an epitaxial wafer grown on an InP substrate for a surface emission laser device is bonded to a high reflection laminate mirror made of GaAs/AlAs thin film pairs grown on a GaAs substrate.

The GaAs/AlAs films as described above, however, combine to create unsatisfactory design flexibility for the surface emission laser devices. Moreover, it is difficult to achieve a desired higher relative refractive index in such a combination, setting limits on the improvement in reflectance of the laminate mirror.

SUMMARY OF THE INVENTION

In view of the above it is an object of the present invention to provide an optical semiconductor device, such as a surface emission laser device, optical cavity, and photodetector, incorporating a semiconductor laminate mirror having a high reflectance comparable with or higher than the reflectance of the conventional laminate mirror made of GaAs/AlAs films. The present invention also provides a method of fabricating such an optical semiconductor device.

It is another object of the present invention to provide a method of fabricating a semiconductor laminate mirror having a high reflectance due to anisotropy in in-plane refractive index and grown by an epitaxial process to thereby generate a polarized laser beam, the structure of the laminate mirror being achieved substantially without affecting the structure of the optical device such as surface emission laser device.

The present invention provides an optical semiconductor device having a compound semiconductor substrate, and a semiconductor laminate mirror formed on the preceding compound semiconductor substrate and made of a plurality of pairs of GaAs or InGaAs film and InAlP film.

The present invention also provides a method of manufacturing an optical semiconductor device including the steps of epitaxially growing a laminate mirror made of a plurality of pairs of GaAs or InGaAs film and InAlP film on a first semiconductor substrate made of, for example, GaAs to form a first wafer, epitaxially growing a semiconductor laminate including a semiconductor active layer on a second semiconductor substrate to form a second wafer, bonding the first wafer to the second wafer such that the top surface of the laminate mirror faces the top surface of the semiconductor laminate and removing the second semiconductor substrate of the second wafer.

A GaP, Si, and InP substrate may be used in place of the GaAs substrate.

Since the refractive index of InAlP lattice-matched with GaAs is smaller than the refractive index of AlAs, the semiconductor laminate mirror made of GaAs/InAlP film pairs or InGaAs/InAlP film pairs has a larger relative refractive index, and accordingly a larger reflectance, compared to the conventional semiconductor laminate mirror made of GaAs/AlAs film pairs.

In a preferred embodiment of the present inventions the semiconductor laminate mirror is fabricated by an epitaxial growth technique on a GaAs substrate such that the InAlP film and GaAs or InGaAs film repeatedly alternate to form a laminated structure, followed by, if desired, epitaxial growth of a GaAs or InGaAs film. The laminate mirror thus fabricated can be used after bonded onto an InP substrate, for example.

In this text, the term "central wavelength" is defined as a wavelength which provides a highest or peak reflectance to the semiconductor laminate mirror among other wavelengths. In case the central wavelength, refractive index of InAlP, refractive index of GaAs are denoted by $\lambda_0$, $n_2$ and $n_1$, respectively, the thickness of the InAlP film and thickness of the GaAs film are preferably adjusted to a magnitude of $\lambda_0/(4n_2)$ and $\lambda_0/(4n_1)$, respectively.

In the present invention, the InAlP film in the semiconductor laminate mirror may have a first composition which is lattice-matched with the GaAs substrate, or a second composition which contains more Al than the Al content in the first composition to deviate from the lattice-matching.

Specifically, the InAlP film in the semiconductor laminate mirror may have a composition of $In_{0.5}Al_{0.5}P$, for instance, so as to be lattice-matched with the GaAs substrate. The InAlP film may have a composition of $In_{1-x}Al_xP$ where x>0.5 so as not to be lattice-matched with the GaAs substrate.

The compound $In_{1-x}Al_xP$ where x>0.5 which is not lattice-matched with GaAs has a larger bandgap than the compound InAlP which is lattice-matched with GaAs. In general, a semiconductor having a larger bandgap has a lower refractive index. The result is that the refractive index of $In_{1-x}Al_xP$ with x>0.5, which is not lattice-matched with GaAs, is smaller than the refractive index of InAlP which is lattice-matched with GaAs. Accordingly, the semiconductor laminate mirror having a lower refractive index layer made of $In_{1-x}Al_xP$ with x>0.5 which is not lattice-matched with GaAs has a higher reflectance compared with the semiconductor laminate mirror which incorporates InAlP film which is lattice-matched with GaAs as a low refractive index semiconductor layer.

The semiconductor laminate mirror having a combination of GaAs and InAlP which is lattice-matched with GaAs is essentially lattice-matched with a GaAs substrate so that the laminate mirror does not suffer from crystal defects caused by lattice-mismatching. Moreover, since InAlP has a larger bandgap than AlAs and other III-V compound including Sb, the laminate mirror suffers less from optical absorption.

The main surface of the GaAs substrate m ay be oriented in (001) lattice plane, and the InAlP film will have a natural super-lattice structure.

The "natural super-lattice" is generally formed as a super-lattice which is obtained by epitaxial growth of a ternary or quaternary compound semiconductor under a specified condition. The natural super-lattice is generally formed in (111), ($\bar{1}$11) (1$\bar{1}$1) or (11$\bar{1}$) lattice plane.

By incorporating InAlP films having a natural super-lattice structure in a semiconductor laminate mirror, anisotropy in refractive index is generated in the lattice plane (001) of the epitaxially grown files. By using the thus generated anisotropy of the in-plane anisotropy in the laminate mirror, polarization control can be achieved in a surface emission laser device. The anisotropic material incorporated in the laminate mirror provides a convenient fabrication process, less anisotropy in light intensity distribution, and a design choice for an active layer independently of the design for the laminate mirror.

The GaAs substrate may have a surface orientation which is 1 degree or more off (001) lattice plane in any direction.

The semiconductor laminate mirror according to the present invention provides an excellent efficiency to a semiconductor optical device such as a surface emission laser device, surface type optical oscillator, or semiconductor photodetector.

The above and other objects, features and advantages of the present invention will be more apparent from the following description referring to the accompanying drawings.

PREFERRED EMBODIMENTS OF THE INVENTION

Now, the present invention is more specifically described based on preferred embodiments thereof with reference to the accompanying drawings.

Figure 1:
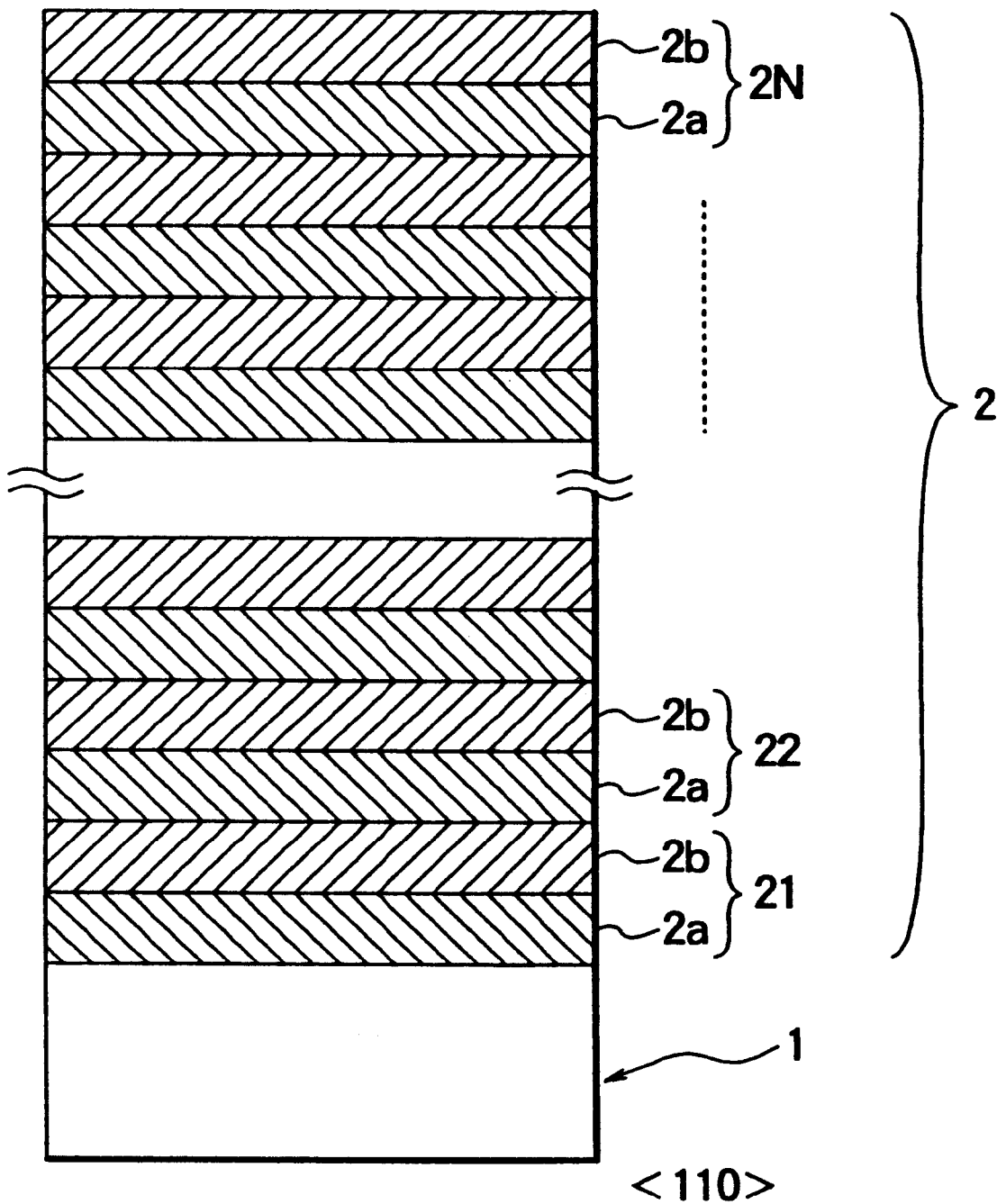
FIG. 1 is a sectional view of a first wafer for an optical semiconductor device according to an embodiment of the present invention at a step of the fabrication process thereof.
Figure 2:
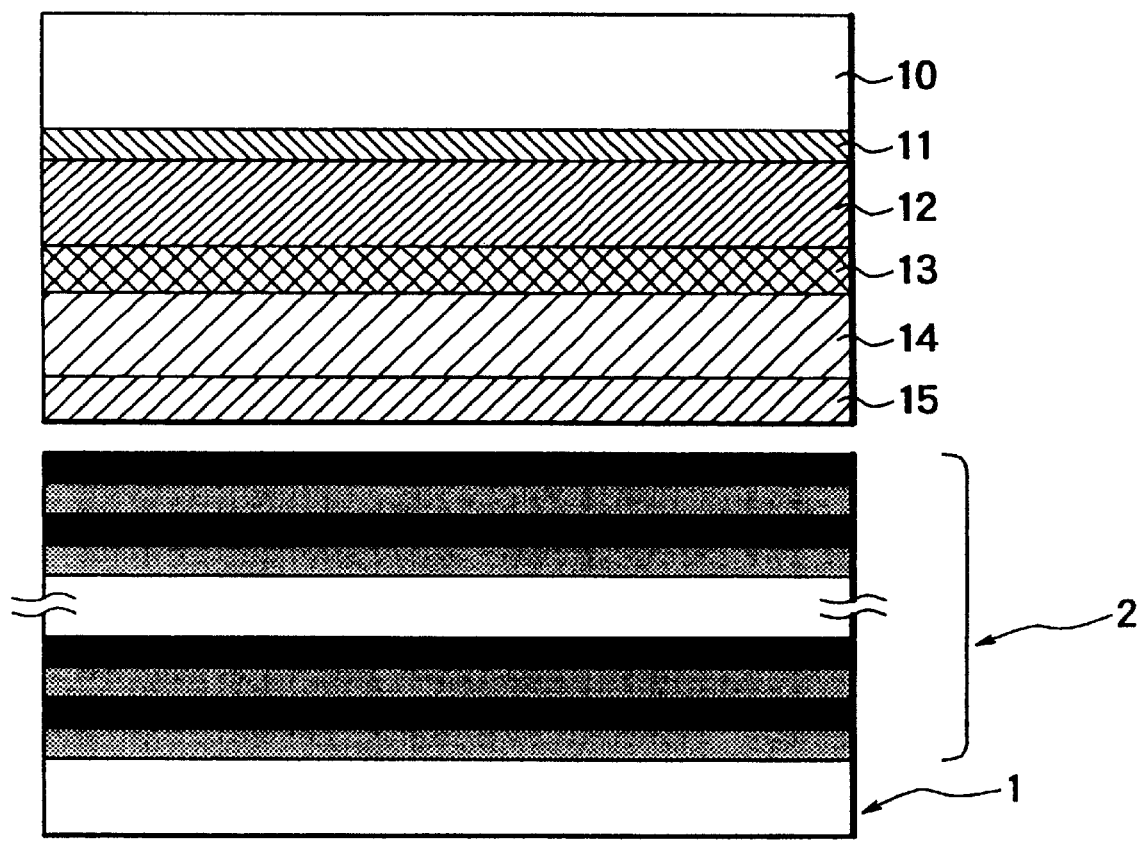
FIG. 2 is a sectional view of unbonded wafers for the semiconductor optical device including the first wafer of FIG. 1 and a second wafer.

FIG. 1 shows a first wafer which is obtained by forming a semiconductor laminate mirror on a first substrate, and FIG. 2 shows a bonded wafer by bonding the first wafer to a second wafer having a semiconductor laminate including a semiconductor active layer. The bonded wafer is used to fabricate an optical semiconductor device according to an embodiment of the present invention.

In FIG. 1, the first wafer comprises a GaAs substrate 1 having a first conductivity type, and a semiconductor laminate mirror 2 including a plurality of pairs 21 to 2N of $In_{1-x}Al_xP$ film 2a where x≥0.5 and GaAs film 2b overlying the InAlP film 2a in the pair. The InAlP film and GaAs film each having a desired thickness are alternately laminated on the GaAs substrate 1. A GaAs buffer layer not shown in the figure may be provided between the bottom InAlP film 2a and the GaAs substrate 1.

If a surface emission laser device having a central wavelength $\lambda_0$=1.3 $\mu$m is designed for the present embodiment, an $In_{0.5}Al_{0.5}P$ film may be employed which is lattice-matched with the GaAs substrate 1 and should have a thickness of approximately 112 nanometers (nm). An $In_{1-x}Al_xP$ film 2a with x>0.5 which is not lattice-matched with the GaAs substrate 1 may be also included and should have a thickness of approximately $\lambda_0/(4n_2)$ provided that $n_2$ is the refractive index of the $In_{1-x}Al_xP$ filim 2a. Specifically, the thickness of InAlP film 2a which is not lattice-matched with the GaAs substrate 2 should be at least 112 nm or thereabout. The thickness of the GaAs film 2b in each pair should be 94 nm.

The laminate mirror 2 is obtained by epitaxially growing on the substrate 1 a first pair 21 through Nth pair each including InAlP film 2a and GaAs film 2b until a desired reflectance is obtained by the N InAlP/GaAs film pairs. Each of the InAlP/GaAs films 2a and 2b is doped during the epitaxial growth to have the first conductivity.

The reflectance R of the semiconductor laminate mirror having N pairs of thin films are given by the following equation:

$$R=((1-n_1\ (n_1/n_2)^{2N})/(1+n_1\ (n_1/n_2)^{2N})).$$

The second wafer having a laser active layer and shown in FIG. 2 is obtained by the following procedure. A first contact layer 11, which is doped with impurities to have a second conductivity that is opposite to the first conductivity for the first wafer is grown on an InP substrate 10, followed by consecutively growing thereon a first resonance layer 12 having the second conductivity and an undoped active layer 13. Subsequently, a second resonance layer 14 and a second contact layer 15 both having the first conductivity type are consecutively grown on the active layer 13.

Thereafter, a direct bonding technique is effected to bond the first wafer including GaAs substrate 1 and laminate mirror 2 onto the second wafer including InP substrate 10 and epitaxial layers 11 to 15, thereby obtaining a bonded wafer wherein both the top surfaces of the epitaxial laminates of the first and second wafers are set in contact with each other. Subsequently, InP substrate 10 is etched away from the bonded wafer, thereby obtaining a semiconductor bonded wafer for a surface emission laser device having a high reflectance semiconductor laminate mirror on the GaAs substrate.

Figure 3:
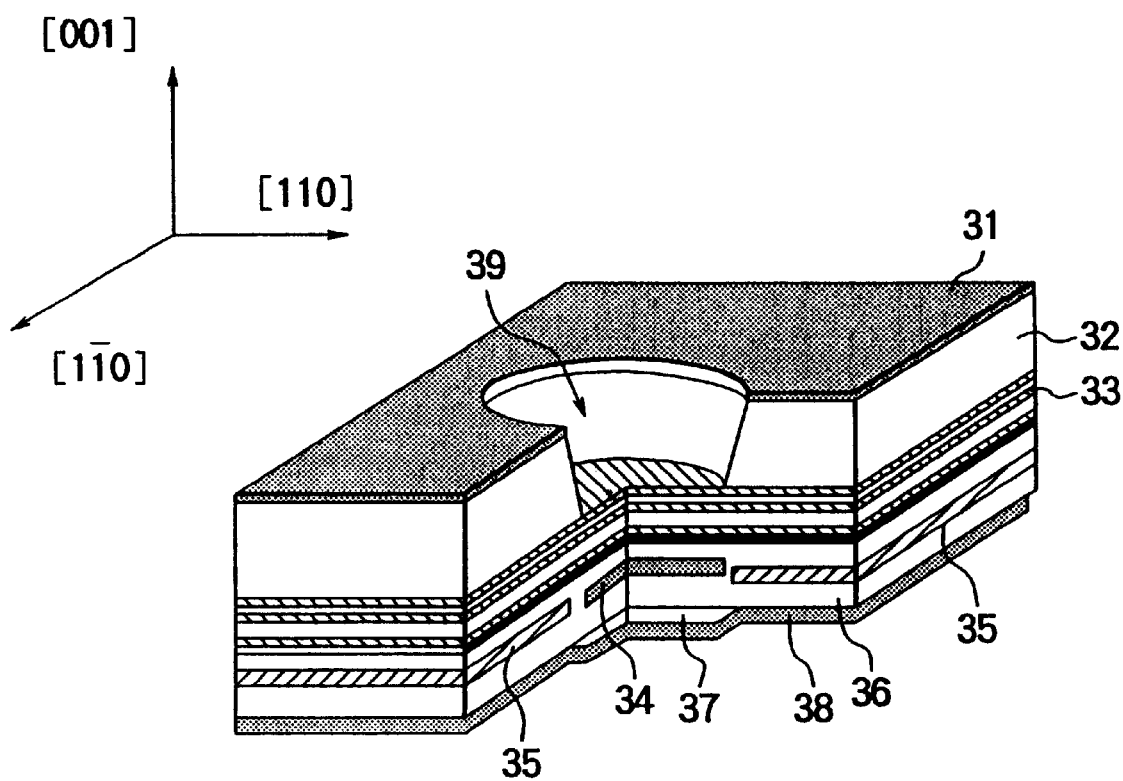
FIG. 3 is a cutaway model of a surface emission laser device fabricated from the bonded wafer of FIG. 2.

A surface emission laser device according to an embodiment of the present invention can be manufactured from the semiconductor bonded wafer shown in FIG. 2. The process thereof is described with reference to FIG. 3 showing a final structure of the surface emission laser device. A semiconductor substrate 32 has a main surface oriented in (100) lattice plane defined by [110] and [$\bar{1}$10] orientations. A laminate mirror 33 formed on the main surface by an epitaxial process has a top surface bonded to the top surface of an epitaxial grown semiconductor laminate including an active layer.

In the fabrication process, a circular SiNx film not shown in the figure is formed, after the bonding and etching steps of the wafers, in a central region located in the center of the semiconductor laminate as viewed in the horizontal direction. By using the circular SiNx mask and an etchant containing hydrochloric acid, a wet etching is effected to the bonded wafer to selectively remove the portion of the epitaxial layers other than the masked portion, thereby forming a cylindrical or column mesa structure including a laser active layer 34 as a main element.

Thereafter, a current blocking layer 35 is formed around the cylindrical mesa by a re-growth process to embed therein the cylindrical mesa structure. Subsequently, a contact layer 36 is formed on the entire surface, followed by the formation of a dielectric laminate mirror 37 by an evaporation technique. Electrodes 38 and 31 are then formed on the entire top surface of the semiconductor laminate and the entire bottom surface of the GaAs substrate 32, respectively. Subsequently, an aperture or opening 39 is formed on the bottom surface of the GaAs substrate 32 to expose the semiconductor laminate mirror for laser emission, thereby obtaining the final structure of FIG. 3.

In the surface emission laser device as described above, the semiconductor laminate mirror having a high relative refractive index between the InAlP/GaAs film pair exhibits a high reflectance to enhance the emission efficiency of the associated laser element.

An optical semiconductor device according to a second embodiment of the present invention can be obtained by modifying the first embodiment. The GaAs substrate has a main surface which is oriented in (001) lattice plane or 1 degree or more off the (001) lattice plane. An InAlP film of each pair for the laminate mirror is grown in a natural super-lattice structure on the GaAs substrate.

The resultant natural super-lattice structure comprises iterated pairs of InP/AlP crystals formed along (111) lattice plane, and exhibits anisotropy in refractive index in the InAlP films to cause anisotropy in reflectance in the resultant laminate mirror between the directions [110] and [$\bar{1}$10] defined by the anisotropy in the refractive index. A surface emission laser device having the laminate mirror according to the present embodiment exhibits anisotropy in the gain of lasing, and lases along a specified polarization direction.

An example of the natural super-lattice according to the present embodiment was formed at a substrate temperature of 670° C. on a GaAs substrate which had an offset-angle of at least 2 degrees. The natural super-lattice was not formed at a substrate temperature of 670° C. on a GaAs substrate which had an offset-angle of 10 degrees.

In the semiconductor laminate mirror in the first embodiment of the present invention, InGaAs film can be also used in place of the GaAs film. Since InGaAs film has a higher refractive index as compared to the GaAs film, it provides a higher relative refractive index and accordingly a higher reflectance to the semiconductor laminate mirror. In this case, the thickness of the InGaAs film should be smaller than the thickness of the GaAs film specified before. For example, InGaAs film should have a thickness of 94 nm or less for the central wavelength $\tau_o$=0.3 mm of the surface emission laser device.

A pair of InAlP film having an anisotropy in refractive index and InGaAs film can also provide a semiconductor laminate mirror having a high reflectance. The laminate mirror having InAlP/InGaAs films has anisotropy in [110] and [$\bar{1}$10] orientations and provides a higher reflectance as compared to the laminate mirror having the pair of InAlP/GaAs films described above.

The semiconductor optical device of the present invention can be formed on an InP or GaAs substrate as a photodetector as well as a surface emission laser device, whereas the semiconductor optical device can be formed on a silicon substrate as a photodetector.

What is claimed is:

1. An optical semiconductor device comprising a semiconductor substrate having thereon a semiconductor laminate mirror constructed of a plurality of pairs, each of said pairs including one of an InAlP layer and a GaAs layer, and an InGaAs layer and a InAlP layer, wherein said semiconductor substrate is made of GaAs and having a main surface oriented in (001) lattice plane, and said InAlP layer includes a natural super-lattice structure.

2. An optical semiconductor device as set forth in claim 1, wherein said semiconductor substrate is made of GaAs, and an Al content of said InAlP layer is outside a range of Al content that provides lattice-matching for InAlP and GaAs.

3. An optical semiconductor device as set forth in claim 1, wherein said semiconductor substrate is made of GaAs, and said laminate mirror includes said InGaAs layer, said InGaAs layer having a composition that is out of a compositional range for lattice-matching of InGaAs and GaAs.

4. An optical semiconductor device as set forth in claim 1, wherein said semiconductor substrate is made of GaAs having a main surface oriented at least one degree off (001) lattice plane and said InAlP layer includes a natural super lattice structure.

5. An optical semiconductor device as set forth in claim 1, which further comprises an epitaxial semiconductor laminate having a semiconductor active layer, said semiconductor laminate being united with said semiconductor laminate mirror, wherein said active layer functions as an optical cavity.

6. An optical semiconductor device as set forth in claim 1, which further comprises an epitaxial semiconductor laminate having a semiconductor active layer said semiconductor laminate being united with said semiconductor laminate mirror, wherein said active layer functions as a photodetector.

* * * * *